(12) United States Patent
Suzu et al.

(10) Patent No.: US 9,613,938 B2
(45) Date of Patent: Apr. 4, 2017

(54) MODULE AND METHOD FOR MANUFACTURING THE MODULE

(71) Applicants: Soichiro Suzu, Tokyo (JP); Tomohito Taki, Tokyo (JP)

(72) Inventors: Soichiro Suzu, Tokyo (JP); Tomohito Taki, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 14/987,892

(22) Filed: Jan. 5, 2016

(65) Prior Publication Data

US 2016/0219707 A1   Jul. 28, 2016

(30) Foreign Application Priority Data

Jan. 28, 2015   (JP) .................. 2015-014359

(51) Int. Cl.
*H05K 1/18* (2006.01)
*H01L 25/10* (2006.01)
(Continued)

(52) U.S. Cl.
CPC .............. *H01L 25/10* (2013.01); *H01L 21/54* (2013.01); *H01L 23/043* (2013.01); *H01L 24/48* (2013.01); *H01L 24/49* (2013.01); *H01L 24/83* (2013.01); *H01L 24/92* (2013.01); *H01L 25/105* (2013.01); *H01L 25/50* (2013.01); *H01L 23/16* (2013.01); *H01L 24/45* (2013.01); *H01L 2224/26175* (2013.01); *H01L 2224/29191* (2013.01); *H01L 2224/3013* (2013.01); *H01L 2224/32225* (2013.01); *H01L 2224/45144* (2013.01); *H01L 2224/45147* (2013.01); *H01L 2224/48135* (2013.01); *H01L 2224/48227* (2013.01); *H01L 2224/49051* (2013.01); *H01L 2224/49175* (2013.01); *H01L 2224/73265* (2013.01); *H01L 2224/83192* (2013.01); *H01L 2224/85186* (2013.01); *H01L 2224/92247* (2013.01); *H01L 2924/00014* (2013.01)

(58) Field of Classification Search
CPC .................................................. H01L 33/486
See application file for complete search history.

(56) References Cited

U.S. PATENT DOCUMENTS 7,320,940 B2    1/2008  Kunda et al.
2013/0017631 A1*  1/2013  Takeda ................. H01L 33/486
                                                                438/26

FOREIGN PATENT DOCUMENTS

JP      2005-101192      4/2005

* cited by examiner

*Primary Examiner* — Seahvosh Nikmanesh
(74) *Attorney, Agent, or Firm* — IPUSA, PLLC

(57) ABSTRACT

A module includes a first substrate including first electrodes; a first element bonded to the first substrate, and including second electrodes disposed at a first end of the first element and third electrodes disposed at a second end of the first element opposite from the first end; a second substrate stacked on the first substrate and including a recess; and a second element bonded to a bottom surface of the recess of the second substrate and including fourth electrodes. The first electrodes of the first substrate are electrically connected to the second electrodes at the first end of the first element, and the third electrodes at the second end of the first element are electrically connected to the fourth electrodes of the second element via a through hole formed in the bottom surface of the recess.

9 Claims, 12 Drawing Sheets

(51) Int. Cl.
*H01L 23/043* (2006.01)
*H01L 21/54* (2006.01)
*H01L 23/00* (2006.01)
*H01L 25/00* (2006.01)
*H01L 23/16* (2006.01)

MODULE AND METHOD FOR MANUFACTURING THE MODULE

CROSS-REFERENCE TO RELATED APPLICATION

The present application is based upon and claims the benefit of priority of Japanese Patent Application No. 2015-014359, filed on Jan. 28, 2015, the entire contents of which are incorporated herein by reference.

BACKGROUND OF THE INVENTION

1. Field of the Invention

An aspect of this disclosure relates to a module and a method of manufacturing the module.

2. Description of the Related Art

There exists a module including a substrate and a semiconductor device mounted on the substrate. Such a module, for example, has a hollow structure and includes two semiconductor devices stacked in a box-shaped recess formed by a bottom plate and side walls of a substrate, and a cover plate provided over the recess (see, for example, Japanese Laid-Open Patent Publication No. 2005-101192).

When a mounting area ratio is defined as a ratio of an area of a semiconductor device mounted on a substrate to an area of the substrate, in order to increase the mounting area ratio of a module having the above-described structure without changing the size of the semiconductor device, it is necessary to reduce the area of the substrate by reducing the thickness of side walls of the substrate. However, reducing the thickness of the side walls may reduce the rigidity of the module and is therefore not preferable. Also, with the above-described structure, because a capillary may interfere with the side walls when wire-bonding the semiconductor device, there is a limit in reducing the area of the substrate.

There also exists a module having a hollow structure that is formed by attaching an inverted-box-shaped cover to a flat substrate to cover a semiconductor device mounted on the substrate. In this case, a margin for attaching the cover is necessary on the substrate, and therefore it is difficult to increase the mounting area ratio by reducing the area of the substrate.

SUMMARY OF THE INVENTION

In an aspect of this disclosure, there is provided a module that includes a first substrate including first electrodes; a first element bonded to the first substrate, and including second electrodes disposed at a first end of the first element and third electrodes disposed at a second end of the first element opposite from the first end; a second substrate stacked on the first substrate and including a recess; and a second element bonded to a bottom surface of the recess of the second substrate and including fourth electrodes. The first electrodes of the first substrate are electrically connected to the second electrodes at the first end of the first element, and the third electrodes at the second end of the first element are electrically connected to the fourth electrodes of the second element via a through hole formed in the bottom surface of the recess.

DESCRIPTION OF THE PREFERRED EMBODIMENTS

Embodiments of the present invention are described below with reference to the accompanying drawings. Throughout the accompanying drawings, the same reference numbers are used for the same components, and overlapping descriptions of those components may be omitted.

Although a semiconductor module is used as an example of a module in the embodiments described below, a module of the present invention may not necessarily include a semiconductor device.

First Embodiment

<Configuration of Semiconductor Module>

Figure 1A:
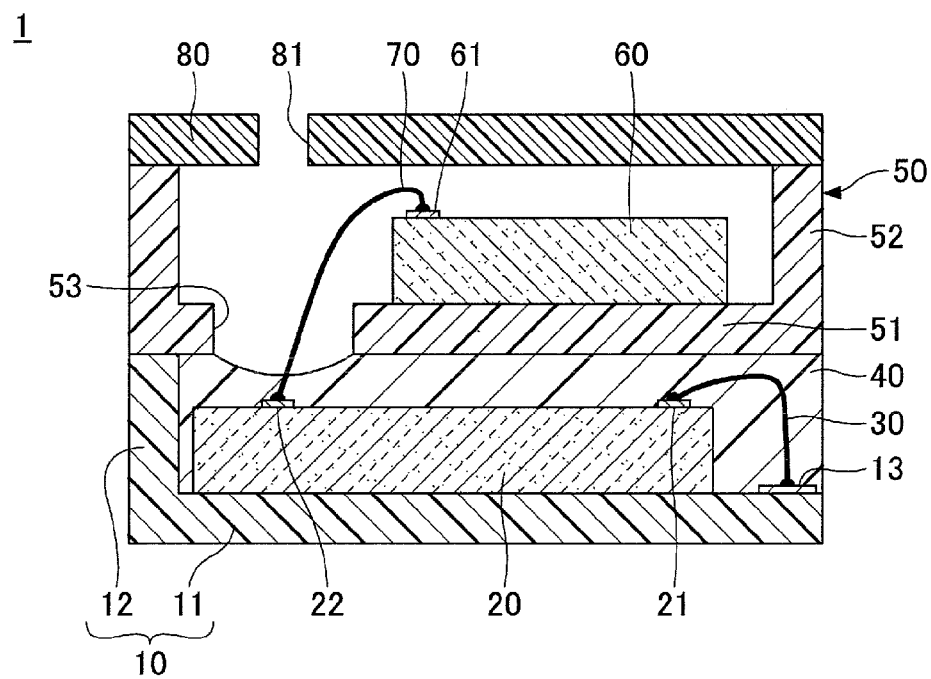
FIGS. 1A and 1B are drawings illustrating a semiconductor module according to a first embodiment.
Figure 1B:
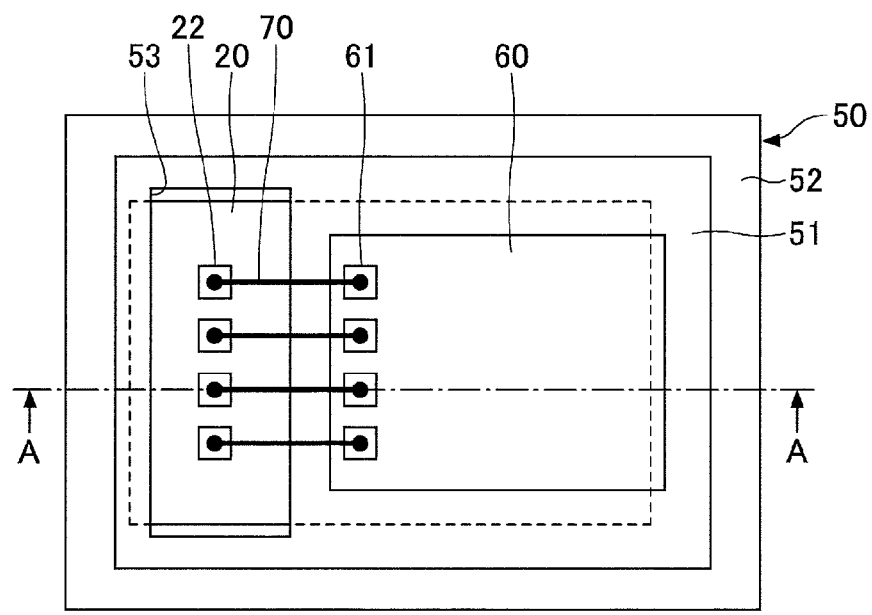

First, an exemplary configuration of a semiconductor module according to a first embodiment is described. FIGS. 1A and 1B are drawings illustrating a semiconductor module 1 according to a first embodiment. FIG. 1B is a plan view of the semiconductor module 1, and FIG. 1A is a cross-sectional view of the semiconductor module 1 taken along line A-A of FIG. 1B. In FIG. 1B, a filling resin 40 and a cover substrate 80 are omitted.

As illustrated by FIGS. 1A and 1B, the semiconductor module 1 includes a substrate 10, a semiconductor device 20, metal wires 30, a filling resin 40, a substrate 50, a semiconductor device 60, metal wires 70, and a cover substrate 80.

In the present embodiment, for descriptive purposes, a side of the semiconductor module 1 where the cover substrate 80 is provided is referred to as an "upper side" or a "first side", and a side of the semiconductor module 1 where the substrate 10 is provided is referred to as a "lower side" or a "second side". Also, a surface of each component facing the cover substrate 80 is referred to as an "upper surface" or a "first surface", and a surface of each component facing the substrate 10 is referred to as a "lower surface" or a "second surface". Nevertheless, the semiconductor module 1 may be used in an upside-down position, and may be disposed at any angle. Further, a plan view indicates a view of an object seen from a direction of a normal line of the upper surface of the substrate 10, and a planar shape indicates a shape of an object seen from the direction of the normal line of the upper surface of the substrate 10.

The semiconductor module 1 has a two-layer structure (package-on-package structure) formed by stacking (or bonding) the substrate 50 (upper layer), on which the semiconductor device 60 is mounted, on the substrate 10 (lower layer) on which the semiconductor device 20 is mounted. The semiconductor device 20 and the semiconductor device 60 are electrically connected to each other via the metal wires 70. A space in the substrate 10 of the lower layer is filled with the filling resin 40, and the substrate 50 of the upper layer has a hollow structure. Next, each component of the semiconductor module 1 is described in more detail.

The substrate 10 includes a bottom plate 11 having a substantially-rectangular planar shape, and side walls 12 formed on the bottom plate 11. The side walls 12 are formed on three sides (outer edges) of the bottom plate 11, and no side wall is formed on the remaining one side of the bottom plate 11. Multiple electrodes 13 are provided at a first end (the right end in FIG. 1A) of the upper surface of the bottom plate 11 of the substrate 10. Also, multiple via holes (not shown) connected to the electrodes 13 and used as external terminals are formed in the bottom plate 11 of the substrate 10 to enable the semiconductor module 1 to send and receive electric signals to and from an external device.

The substrate 10 may be implemented by, for example, a glass epoxy substrate, a ceramic substrate, or a silicon substrate. The length of each side of the bottom plate 11 of the substrate 10 may be, for example, between about 1.5 mm and about 5 mm. The thickness of the bottom plate 11 and the side walls 12 of the substrate 10 may be, for example, between about 50 μm and about 100 μm. The height of the substrate 10 may be, for example, about several hundred μm.

The semiconductor device 20 is mounted in a face-up position on the upper surface of the bottom plate 11 of the substrate 10 Multiple electrodes 21 are provided at a first end (the right end in FIG. 1A) of the upper surface of the semiconductor device 20. Also, multiple electrodes 22 are provided at a second end (the left end in FIG. 1A), which is opposite from the first end, of the upper surface of the semiconductor device 20.

The electrodes 21 of the semiconductor device 20 are electrically connected to the corresponding electrodes 13 of the substrate 10 via the metal wires 30. The metal wires 30 may be implemented by, for example, gold wires or copper wires (so-called bonding wires).

The filling resin 40 is in contact with the upper surface of the bottom plate 11 and the inner surfaces of the side walls 12 of the substrate 10, and covers the semiconductor device 20 and the metal wires 30. The filling resin 40 is not provided in a space (a recess formed by the substrate 50) above a bottom plate 51 of the substrate 50 (i.e., the space is unfilled). As the filling resin 40, for example, an underfill resin consisting mainly of an epoxy resin may be used. The filling resin 40 may include a filler.

The substrate 50 includes the bottom plate 51 having a substantially-rectangular planar shape, and side walls 52 formed on the bottom plate 51. In the substrate 50, different from the substrate 10, the side walls 52 are formed on all four sides (outer edges) of the bottom plate 51. In other words, a box-shaped recess is formed by the bottom plate 51 and the side walls 52 of the substrate 50. A through hole 53 is formed in the bottom plate 51 of the substrate 50.

The substrate 50 may be implemented by, for example, a glass epoxy substrate, a ceramic substrate, or a silicon substrate. The length of each side of the bottom plate 51 of the substrate 50 may be between about 1.5 mm and about 5 mm. The thickness of the bottom plate 51 and the side walls 52 of the substrate 50 may be between about 50 μm and about 100 μm. The height of the substrate 50 may be, for example, about several hundred μm. In the present embodiment, no wire and no electrode are formed on the substrate 50.

The semiconductor device 60 is mounted in a face-up position on the upper surface of the bottom plate 51 (the bottom of the recess) of the substrate 50. Multiple electrodes 61 are provided on the upper surface of the semiconductor device 60. The electrodes 61 of the semiconductor device 60 are electrically connected to the corresponding electrodes 22 of the semiconductor device 20 via the metal wires 70 that pass through the through hole 53. The metal wires 70 may be implemented by, for example, gold wires or copper wires (so-called bonding wires).

The cover substrate 80 is fixed to the upper end of the substrate 50 (i.e., the upper surfaces of the side walls 52). The cover substrate 80 is provided to protect components such as the semiconductor device 60 in the recess of the substrate 50. When, for example, the semiconductor device 60 is a pressure sensor including a diaphragm and the semiconductor device 20 is an integrated circuit (IC) for processing a signal from the semiconductor device 60, a through hole 81 may be formed in the cover substrate 80 to introduce a gas to be measured by the semiconductor device 60 into the recess. When the through hole 81 is not necessary for the function of the semiconductor device 60, the upper opening of the substrate 50 may be completely covered by the cover substrate 80. The cover substrate 80 may be implemented by, for example, a glass epoxy substrate, a ceramic substrate, or a silicon substrate. The thickness of the cover substrate 80 may be, for example, between about 50 μm and about 100 μm.

In the present embodiment, the side walls 12 of the substrate 10 are formed on three sides of the bottom plate 11. However, the side wall(s) 12 of the substrate 10 may be formed only on one or two sides of the bottom plate 11. In any case, the electrodes 13 are provided on a side of the bottom plate 11 on which no side wall 12 is formed.

<Method of Manufacturing Semiconductor Module>

Next, an exemplary method of manufacturing the semiconductor module 1 of the first embodiment is described. FIGS. 2A through 8B are drawings illustrating an exemplary process of manufacturing the semiconductor module 1 of the first embodiment.

Figure 2A:
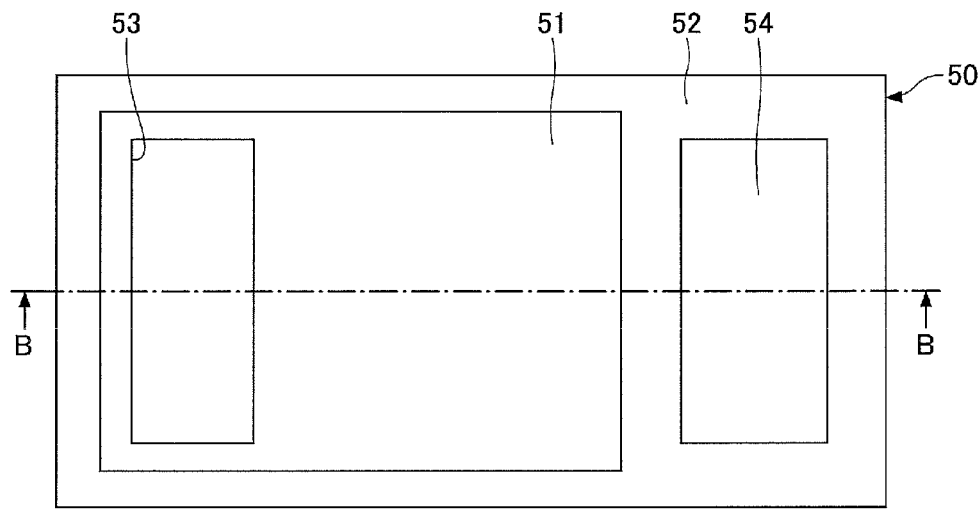
FIGS. 2A and 2B are drawings illustrating a process of manufacturing a semiconductor module according to the first embodiment.
Figure 2B:
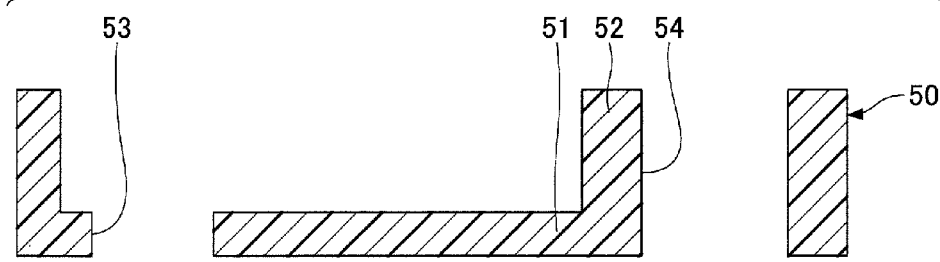

At a step illustrated by FIGS. 2A and 2B, the substrate 50 is prepared. The substrate 50 is eventually cut to form a structure including the bottom plate 51, the side walls 52, and the through hole 53 as illustrated in FIGS. 1A and 1B. At this stage, however, a wide side wall 52 is formed outside of the recess (at the right end in FIGS. 2A and 2B), and a through hole 54 is formed in the wide side wall 52. The substrate 50 may be formed, for example, by performing counter boring, etching, and/or cutting on a glass epoxy substrate. Although one substrate 50 for one semiconductor module 1 is illustrated in FIGS. 2A and 2B, in an actual manufacturing process, a collective substrate, where multiple substrates 50 having the configuration of FIGS. 2A and 2B are arranged in an array of rows and columns, may be prepared. FIG. 2A is a plan view of the substrate 50, and FIG. 2B is a cross-sectional view of the substrate 50 taken along line B-B of FIG. 2A.

Figure 3:
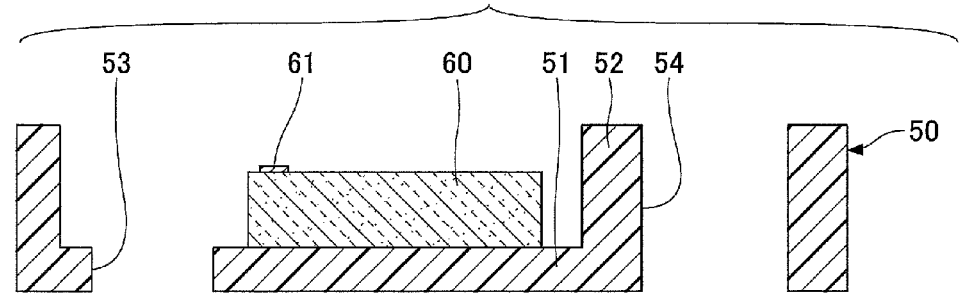
FIG. 3 is a drawing illustrating a process of manufacturing a semiconductor module according to the first embodiment.

At a step illustrated by FIG. 3, the semiconductor device 60 with multiple electrodes 61 formed on its upper surface is bonded in a face-up position to the upper surface (the bottom of the recess) of the bottom plate 51 of the substrate 50. For example, a silicone adhesive may be used for the bonding.

Figure 4A:
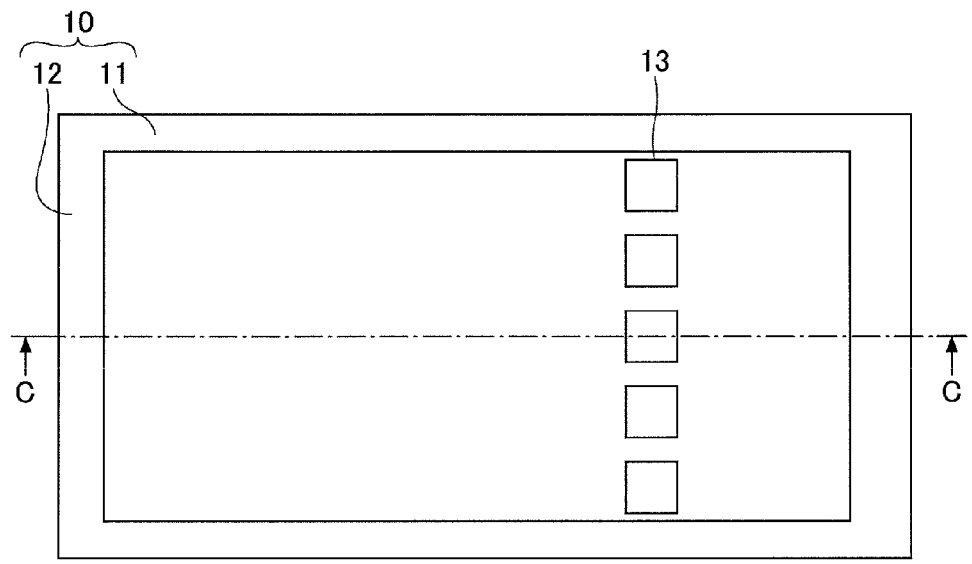
FIGS. 4A and 4B are drawings illustrating a process of manufacturing a semiconductor module according to the first embodiment.
Figure 4B:
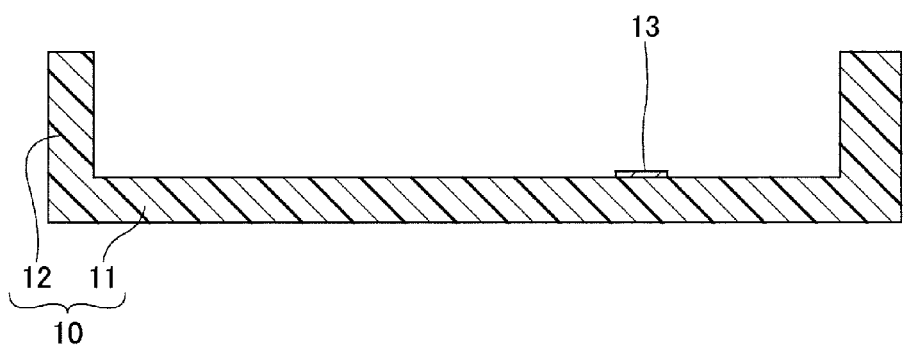

At a step illustrated by FIGS. 4A and 4B, the substrate 10 is prepared. The substrate 10 is eventually cut to form a structure including the bottom plate 11 and the side walls 12 as illustrated in FIG. 1A. At this stage, however, a side wall 12 is also formed at the first end (the right end in FIGS. 4A and 4B) of the bottom plate 11, and a box-shaped recess is formed by the bottom plate 11 and the side walls 12 on the four sides. The substrate 10 may be formed, for example, by performing counter boring, etching, and/or cutting on a glass epoxy substrate. After the substrate 10 is prepared, multiple electrodes 13 and multiple via holes (not shown) used as external terminals are formed on and in the substrate 10. Although one substrate 10 for one semiconductor module 1 is illustrated in FIGS. 4A and 4B, in an actual manufacturing process, a collective substrate, where multiple substrates 10 having the configuration of FIGS. 4A and 4B are arranged in an array of rows and columns, may be prepared. FIG. 4A is a plan view of the substrate 10, and FIG. 4B is a cross-sectional view of the substrate 10 taken along line C-C of FIG. 4A.

Figure 5:
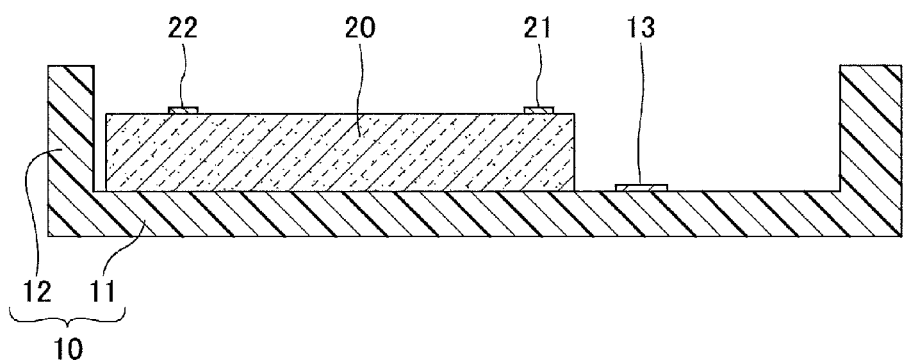
FIG. 5 is a drawing illustrating a process of manufacturing a semiconductor module according to the first embodiment.

At a step illustrated by FIG. 5, the semiconductor device 20 is bonded in a face-up position to the upper surface (the bottom of the recess) of the bottom plate 11 of the substrate 10. Multiple electrodes 21 have been formed at a first end of the upper surface of the semiconductor device 20, and multiple electrodes 22 have been formed at a second end of the upper surface of the semiconductor device 20. For example, an epoxy adhesive may be used for the bonding.

Figure 6A:
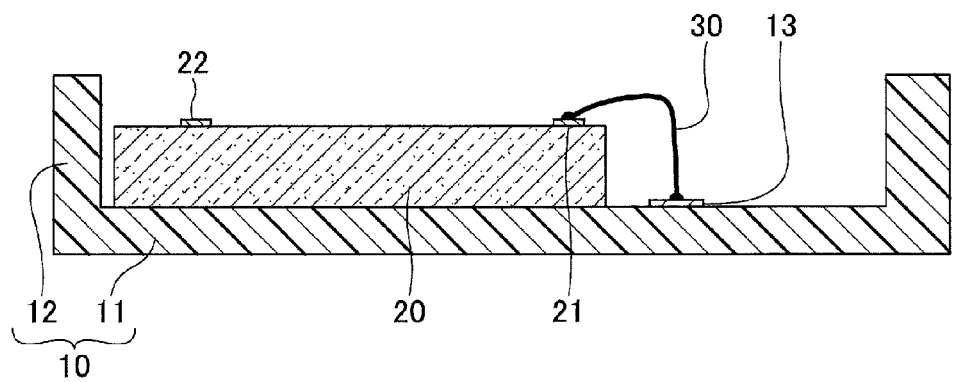
FIGS. 6A and 6B are drawings illustrating a process of manufacturing a semiconductor module according to the first embodiment.

At a step illustrated by FIG. 6A, the electrodes 13 of the substrate 10 and the electrodes 21 of the semiconductor device 20 are connected to each other using the metal wires 30 (wire bonding). A reverse bonding technique may be used to connect the metal wires 30 to the electrodes 13 and 21. This makes it possible to reduce the height of the metal wires 30 protruding from the upper surface of the semiconductor device 20. In a reverse bonding technique, metal balls formed at ends of the metal wires 30 are first connected to the lower electrodes 13, the metal wires 30 are looped at about the height of the upper electrode 21, and then the metal wires 30 are connected to the upper electrodes 21.

Figure 6B:
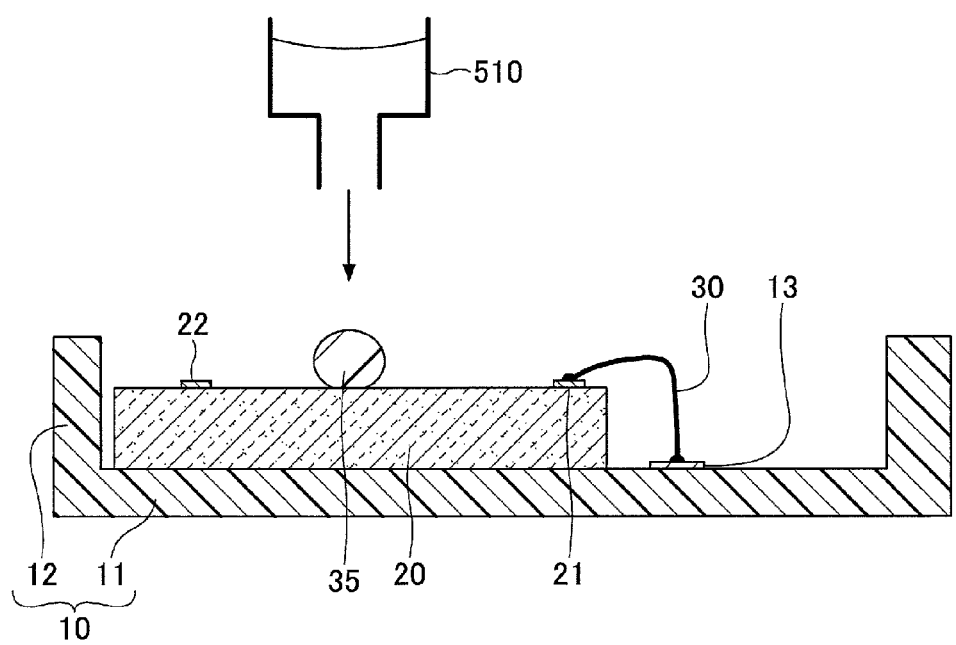

At a step illustrated by FIG. 6B, a substrate support 35 is applied to the upper surface of the semiconductor device 20 using an applicator 510. The substrate support 35 is used to support the substrate 50 on the substrate 10 in the next step. For example, an epoxy resin may be used as the substrate support 35. Either one of the steps illustrated by FIGS. 2A through 3 and the steps illustrated by FIGS. 4A through 6B may be performed first. Also, the steps illustrated by FIGS. 2A through 3 and the steps illustrated by FIGS. 4A through 6B may be performed concurrently.

Figure 7A:
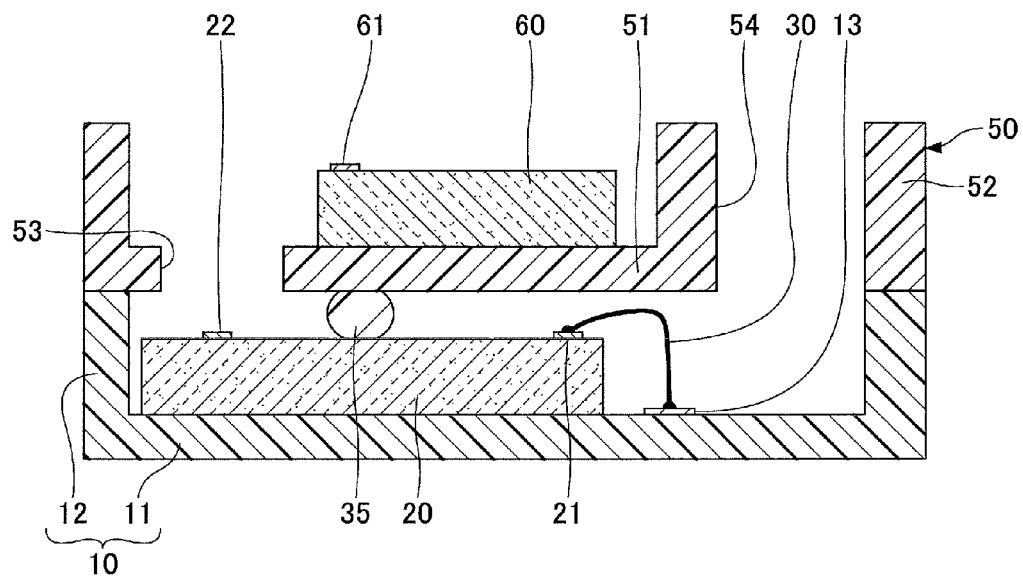
FIGS. 7A and 7B are drawings illustrating a process of manufacturing a semiconductor module according to the first embodiment.

At a step illustrated by FIG. 7A, the substrate 50 with the semiconductor device 60 (i.e., a structure formed at the step of FIG. 3) is stacked via the substrate support 35 on the substrate 10 and bonded to the substrate 10. Then, the substrate support 35 is cured by, for example, heating so that the substrate support 35 can support the substrate 50 on the substrate 10. Although the substrate 10 and the substrate 50 are to be fixed together using the filling resin 40 at a later step, the substrate support 35 is used to support the substrate 50 on the substrate 10 and prevent the substrate 50 from moving relative to the substrate 10 in a step before injecting the filling resin 40.

Figure 7B:
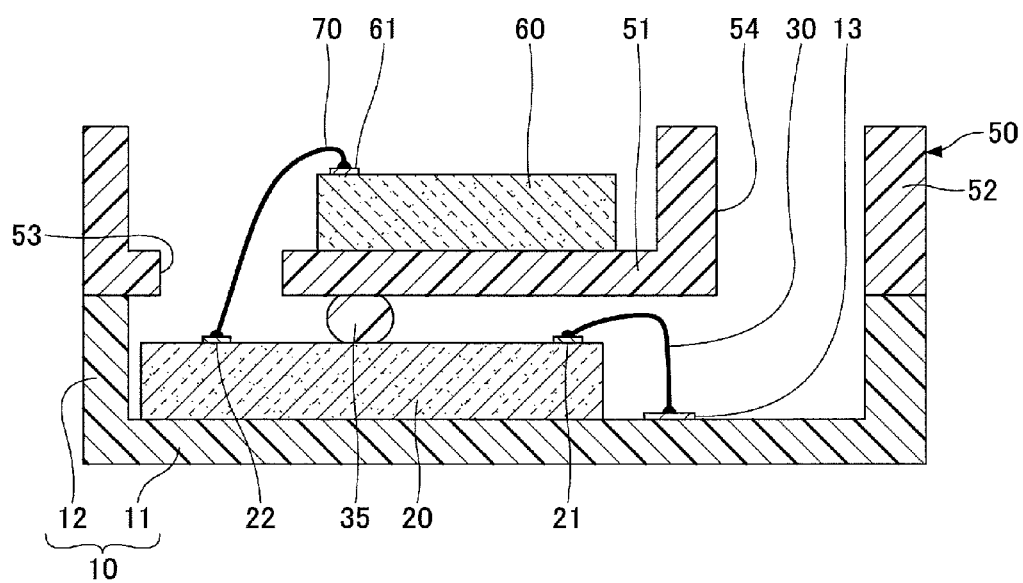

At a step illustrated by FIG. 7B, the electrodes 61 of the semiconductor device 60 and the electrodes 22 of the semiconductor device 20 are connected to each other using the metal wires 70 passing through the through hole 53 (wire bonding). Because the substrate 50 is supported by the substrate support 35 on the substrate 10, the wire bonding can be performed stably. Similarly to the case of the metal wires 30, a reverse bonding technique may be used to connect the metal wires 70 to the electrodes 22 and 61.

Figure 8A:
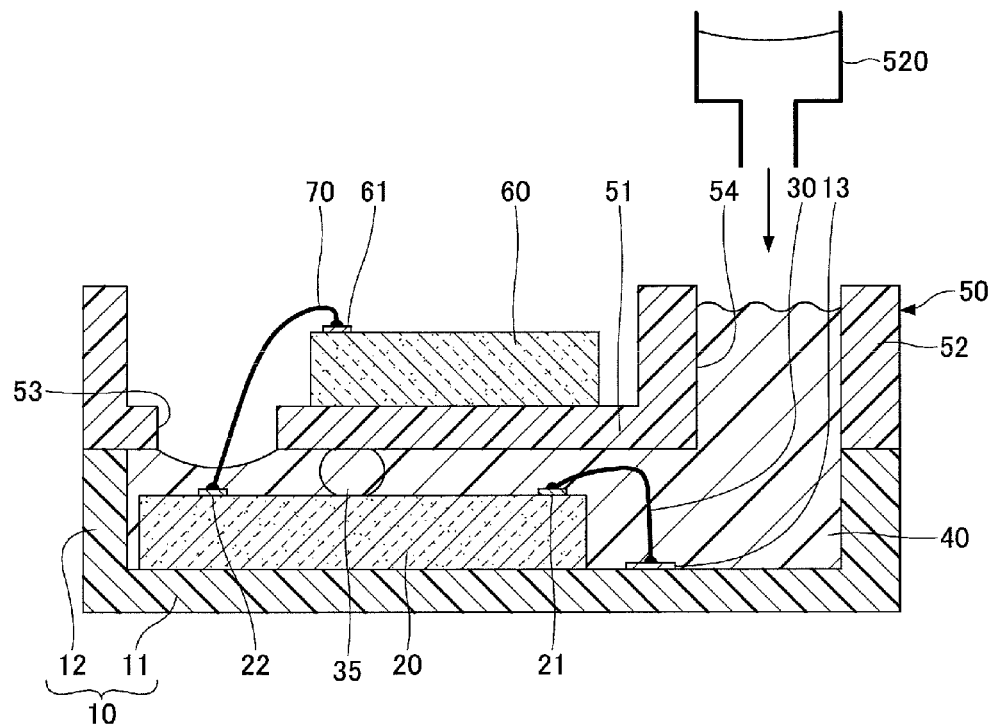
FIGS. 8A and 8B are drawings illustrating a process of manufacturing a semiconductor module according to the first embodiment.

At a step illustrated by FIG. 8A, the filling resin 40 is injected by a resin injector 520 via the through hole 54 of the substrate 50 into a space between the substrate 10 and the substrate 50 to cover the semiconductor device 20. At this step, the resin injector 520 is controlled such that the filling resin 40 does not flow into a space above the bottom plate 51 of the substrate 50. Then, the filling resin 40 is cured by, for example, heating. As the filling resin 40, for example, an underfill resin consisting mainly of an epoxy resin may be used.

Figure 8B:
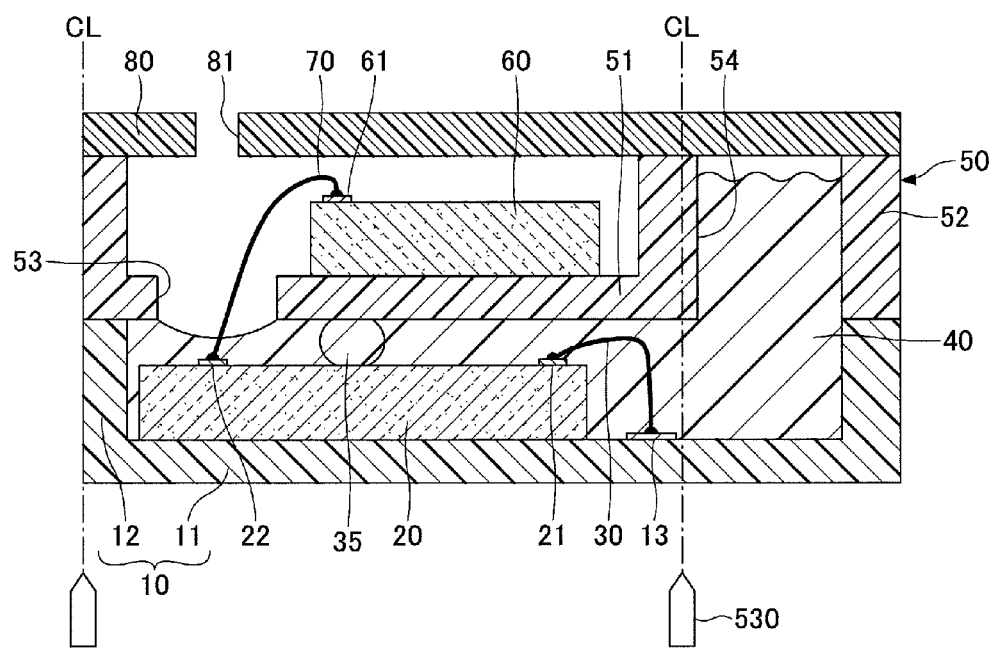

At a step illustrated by FIG. 8B, the cover substrate 80 is bonded to the upper end of the substrate 50 (i.e., the upper surfaces of the side walls 52) of the structure illustrated by FIG. 8A. Although one assembly for one semiconductor module 1 is illustrated in FIG. 8B, in an actual manufacturing process, a collective substrate, where multiple cover substrates 80 having the configuration of FIG. 8B are arranged in an array of rows and columns, may be bonded to an array of the substrates 50.

After bonding the cover substrates 80 to the substrates 50, an array of resulting assemblies is cut at cutting locations CL using, for example, a dicing blade 530. As a result, a part (partial structure) including the through hole 54 is removed from each assembly, and separate semiconductor modules 1 as illustrated by FIG. 1 are obtained. Although FIG. 8B is in the same orientation as FIG. 8A for illustration purposes, in practice, the array of assemblies is turned upside down and cut from the upper side using the dicing blade 530.

Thus, in the method of manufacturing the semiconductor module 1 of the present embodiment, the electrodes 13 are formed only at the first end of the substrate 10 constituting the first (lower) layer, and a sufficient space is provided between the electrodes 13 and the side wall 12 at the first end. Accordingly, this configuration prevents a capillary from interfering with the side wall 12 when the electrodes 13 of the substrate 10 are wire-bonded to the electrode 21 of the semiconductor device 20.

Also, because the side wall 12 at the first end of the substrate 10 is finally removed, the resulting semiconductor module 1 does not have the side wall 12 at the first end of the substrate 10 where the electrodes 13 are formed. Further, because no electrode 13 is formed at sides of the substrate 10 where the side walls 12 are finally present, it is possible to position an outer surface of the semiconductor device 20 close to the inner surface of the corresponding side wall 12 without taking into account the wire bonding step.

Thus, compared with related-art configurations, the configuration of the present embodiment makes it possible to increase the mounting area ratio of the area of the semiconductor device 20 to the area of the substrate 10. For example, with related-art configurations, it is difficult to achieve a mounting area ratio greater than 50%. On the other hand, with the configuration of the present embodiment, it is possible to achieve a mounting area ratio greater than 50%.

Also, because the space in the substrate 10 constituting a first layer is filled with the filling resin 40, it is possible to maintain the rigidity of the substrate 10 even when the thickness of the side walls 12 is reduced or one or more of the side walls 12 are removed.

The semiconductor device 60 of a second layer is mounted on the bottom plate 51 of the substrate 50 within the planar shape of the substrate 10 such that the semiconductor device 60 partially or wholly overlaps the semiconductor device 20 of the first layer in plan view, and is connected to the semiconductor device 20 via the metal wires 70 passing through the through hole 53. This configuration makes it possible to mount the semiconductor devices 20 and 60 and connect them to each other such that the semiconductor devices 20 and 60 do not protrude out of the substrate 10 in plan view even when the mounting area ratios of the upper and lower substrates 10 and 50 are almost the same. This in turn makes it possible to reduce the size of the semiconductor module 1.

Also with the present embodiment, because the mounting position of the semiconductor device 60 of the second layer can be adjusted freely, the size of the semiconductor device 60 of the second layer can be determined without taking into account the wire-boding area of the semiconductor device 20 of the first layer.

Second Embodiment

According to a second embodiment, the substrate 10 includes no side wall. In the second embodiment, descriptions of components that are the same as the components of the semiconductor module 1 of the first embodiment may be omitted.

Figure 9:
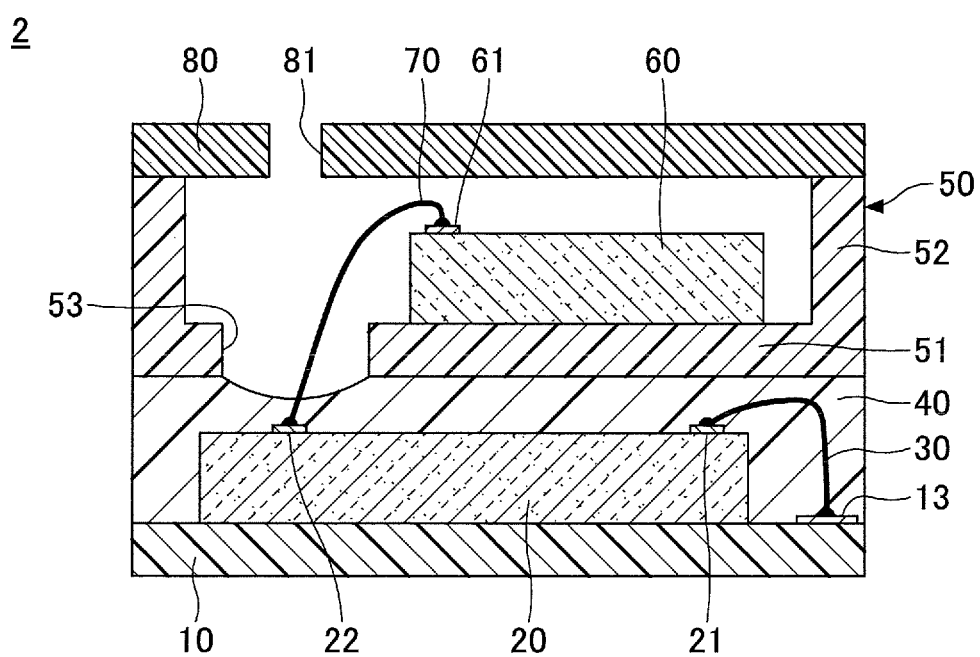
FIG. 9 is a cross-sectional view of a semiconductor module according to a second embodiment.

FIG. 9 is a cross-sectional view of a semiconductor module 2 according to the second embodiment. The cross section of FIG. 9 corresponds to the cross section of FIG. 1A.

As illustrated by FIG. 9, the semiconductor module 2 of the second embodiment is different from the semiconductor module 1 (see FIG. 1A) of the first embodiment in that the substrate 10 includes no side wall and is composed only of a bottom plate. That is, the substrate 10 is a flat plate, and no part of the substrate 10 is in contact with the substrate 50. A space between the upper surface of the substrate 10 and the lower surface of the bottom plate 51 of the substrate 50 is filled with the filling resin 40 to support the substrate 50.

Figure 10A:
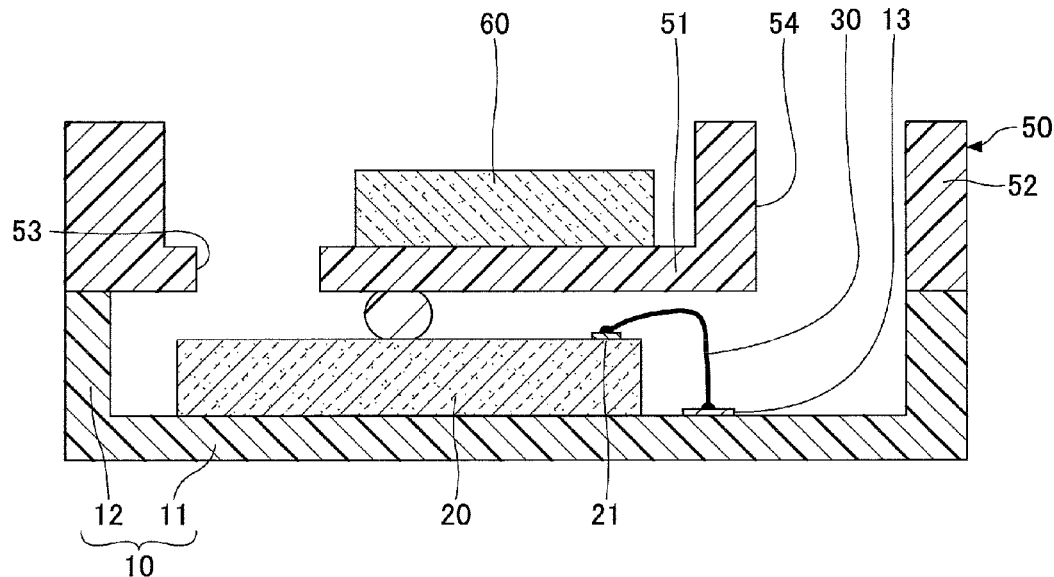
FIGS. 10A and 10B are drawings illustrating a process of manufacturing a semiconductor module according to the second embodiment.

In an exemplary process of manufacturing the semiconductor module 2, steps similar to those described with reference to FIGS. 2A through 7A in the first embodiment are performed to produce a structure as illustrated by FIG. 10A. At the stage of FIG. 10A, the substrate 10 includes the bottom plate 11 and the side walls 12. Also, the side walls 52 on three sides of the bottom plate 51 of the substrate 50, except for the side wall 52 on a side where the through hole 54 is formed, are made thicker than the side walls 52 of the semiconductor module 1 so that, when the substrate 50 is stacked on the substrate 10, the inner surfaces of the three side walls 52 are located at positions closer to the center of the semiconductor module 2 than the inner surfaces of the corresponding side walls 12 of the substrate 10.

Figure 10B:
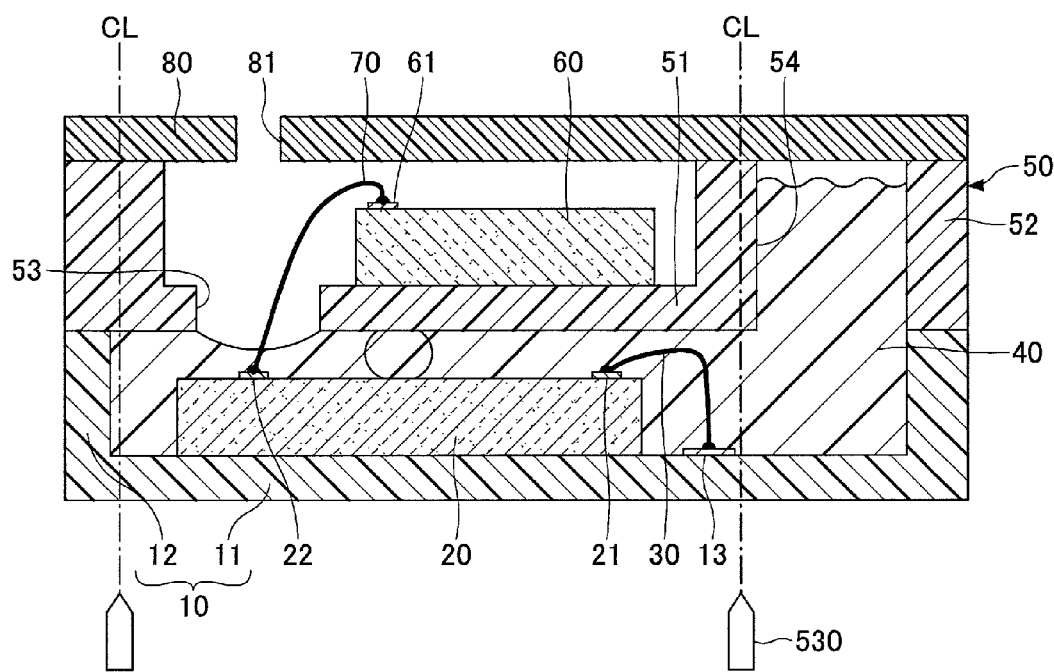

Next, steps similar to those described with reference to FIGS. 7B and 8A in the first embodiment are performed. Then, at a step illustrated by FIG. 10B, an array of resulting assemblies is cut at cutting locations CL in a manner similar to the step of FIG. 8B. In the second embodiment, however, the cutting location CL corresponding to each of the three side walls 52 is closer to the center of the semiconductor module 2 than the inner surface of the corresponding side wall 12. Accordingly, all the side walls 12 of the substrate 10 are cut off, and multiple semiconductor modules 2 (see FIG. 9), each including the substrate 10 comprised only of the bottom plate 11, are obtained. Although FIG. 10B is in the same orientation as FIG. 10A for illustration purposes, in practice, the array of assemblies is turned upside down and cut from the upper side using the dicing blade 530.

Compared with the configuration of the semiconductor module 1, the configuration of the semiconductor module 2 makes it possible to further increase the mounting area ratio. In other words, when semiconductor devices of the same size are to be mounted on the substrates 10 of the semiconductor modules 1 and 2, the substrate 10 of the semiconductor module 2 can be made smaller than the substrate 10 of the semiconductor module 1. This in turn makes it possible to reduce the size of the entire package of the semiconductor module 2. Still in other words, when the substrates 10 of the semiconductor modules 1 and 2 have the same size, a larger semiconductor device can be mounted on the substrate 10 of the semiconductor module 2.

Here, the size of the semiconductor device 20 that can be mounted on the substrate 10 of the semiconductor module 2 is described with reference to FIG. 11.

Figure 11:
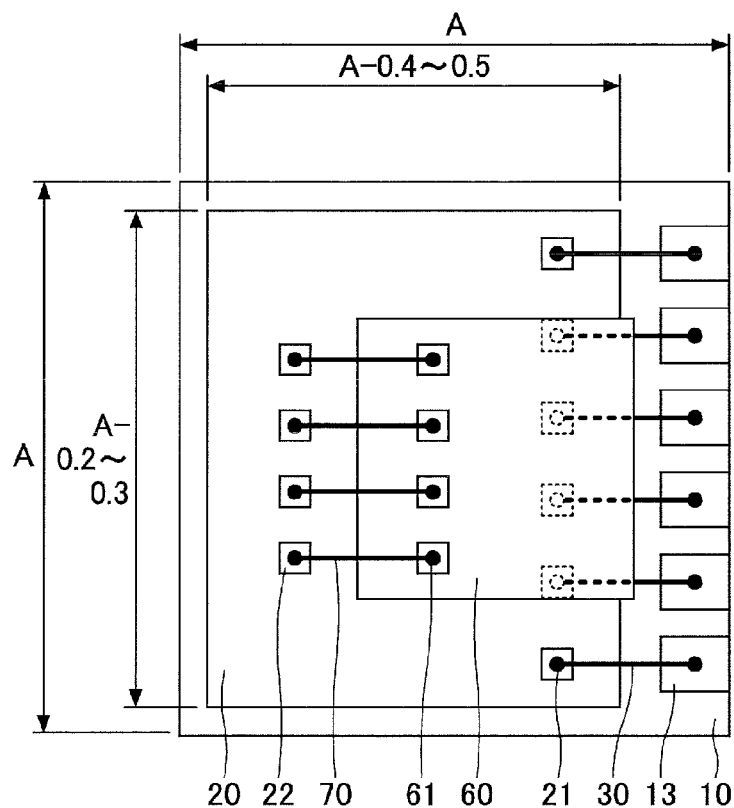
FIG. 11 is a drawing used to describe an effect of a semiconductor module according to the second embodiment.

In FIG. 11, it is assumed that the substrate 10 has an area of A×A. In the case of the semiconductor module 2, the substrate 10 has no side wall, and no margin for attaching a cover is necessary on the substrate 10. For this reason, a semiconductor device 20 with a vertical length of up to about "A−(0.2 through 0.3)" and a horizontal length of up to about "A−(0.4 through 0.5)", i.e., with an area of up to about "(A−(0.2 through 0.3))×(A−(0.4 through 0.5))", can be mounted on the substrate 10. Here, the horizontal length is shorter than the vertical length because an area for the electrode 13 needs to be provided on the substrate 10.

"A" is, for example, a value between about 1.5 mm and about 5 mm. Assuming that A=2 mm, the area of the substrate 10 becomes A×A=4 mm$^2$, and the area of the semiconductor device 20 becomes about 64% through 72% of the area of the substrate 10. That is, the mounting area ratio becomes about 64% through 72%.

Because the mounting area ratios of the related-art semiconductor modules are less than 50%, it can be said that the configuration of the semiconductor module 2 can greatly improve the mounting area ratio. That is, even when a semiconductor device is too large to be mounted on a substrate of a given size according to the related-art configuration, the configuration of the semiconductor module 2 makes it possible to mount the semiconductor device on a substrate of the same size.

Third Embodiment

According to a third embodiment, the semiconductor device 60 is disposed on a resist. In the third embodiment, descriptions of components that are the same as the components of the semiconductor module 1 of the first embodiment may be omitted.

Figure 12:
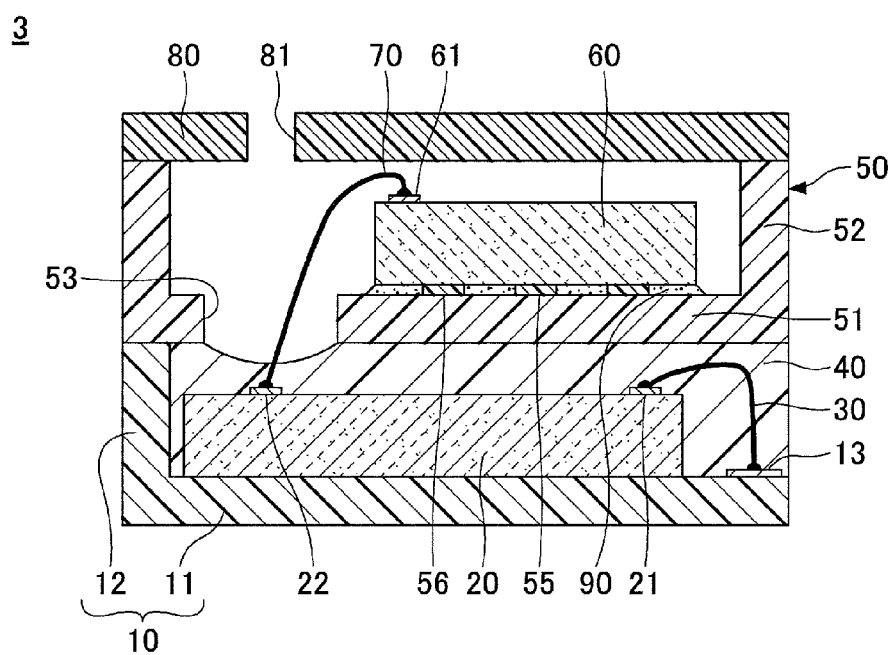
FIG. 12 is a cross-sectional view of a semiconductor module according to a third embodiment.

FIG. 12 is a cross-sectional view of a semiconductor module 3 according to the third embodiment. The cross section of FIG. 12 corresponds to the cross section of FIG. 1A.

As illustrated by FIG. 12, the semiconductor module 3 of the third embodiment is different from the semiconductor module 1 (see FIG. 1A) of the first embodiment in that a resist partition 55 and resist spacers 56 are formed on the upper surface of the bottom plate 51 of the substrate 50, and the semiconductor device 60 is bonded with an adhesive resin 90 to the resist spacers 56.

Figure 13A:
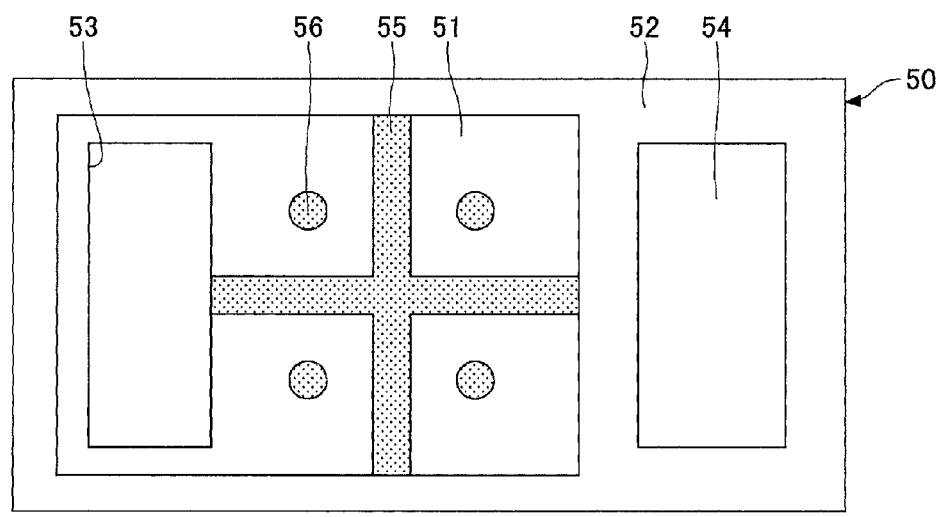
FIGS. 13A and 13B are drawings illustrating a process of manufacturing a semiconductor module according to the third embodiment.

In an exemplary process of manufacturing the semiconductor module 3, the substrate 50 illustrated by FIGS. 2A and 2B is first prepared. Next, with, for example, a print process using a solder resist, the resist partition 55 and the resist spacers 56 are formed on the upper surface of the bottom plate 51 of the substrate 50 as illustrated by FIG. 13A. The resist partition 55 is provided to prevent the adhesive resin 90 from spreading. The resist spacers 56 are pedestals on which the semiconductor device 60 is mounted.

For example, the resist partition 55 is formed in a cross shape, and one resist spacer 56 is formed in each of areas formed by partitioning the upper surface of the bottom plate 51 with the cross-shaped resist partition 55. However, the shape of the resist partition 55 and the number of resist spacers 56 formed in each partitioned area are not limited to the examples of FIG. 13A. The height of the resist partition 55 and the resist spacers 56 may be, for example, between about 10 μm and 40 μm.

Figure 13B:
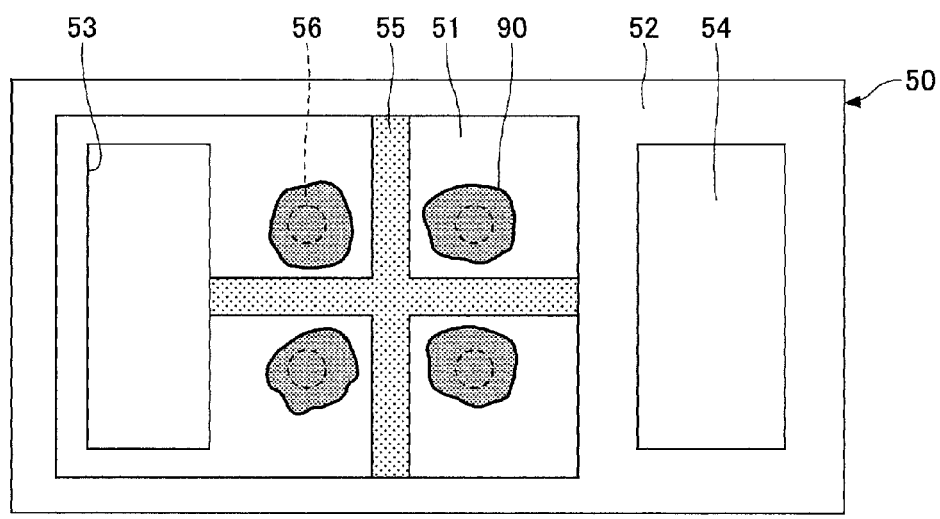

Next, at a step illustrated by FIG. 13B, the adhesive resin 90 is applied to each resist spacer 56 and an area surrounding each resist spacer 56. The adhesive resin 90 for bonding the semiconductor device 60 preferably has elasticity (Young's modulus) lower than that of an adhesive resin (e.g., epoxy resin) for bonding the semiconductor device 20. As the adhesive resin 90, for example, a silicone resin, which is an adhesive resin having a low Young's modulus, may be used. Also, an epoxy urethane resin, which is an adhesive resin having a low Young's modulus, may be used as the adhesive resin 90.

The Young's modulus of a silicone resin is about $1.0 \times (10^{-2}$ through $10^{-3})$ GPa, and the Young's modulus of an epoxy urethane resin is about $50.0 \times (10^{-2}$ through $10^{-3})$ GPa. The Young's moduli of the above resins are far smaller than the Young's modulus of about 5.0 through 10.0 GPa of an epoxy resin used to bond the semiconductor device 20.

Figure 14A:
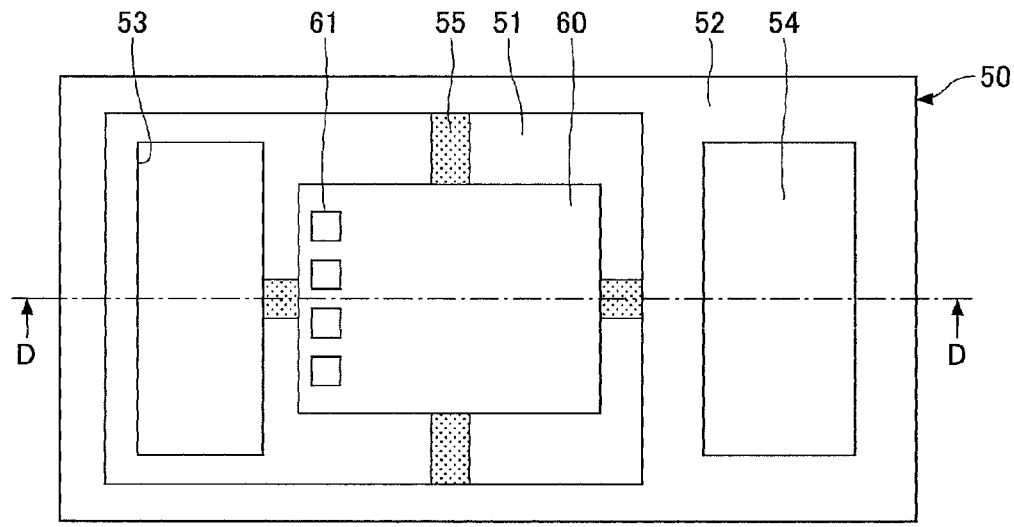
FIGS. 14A and 14B are drawings illustrating a process of manufacturing a semiconductor module according to the third embodiment.
Figure 14B:
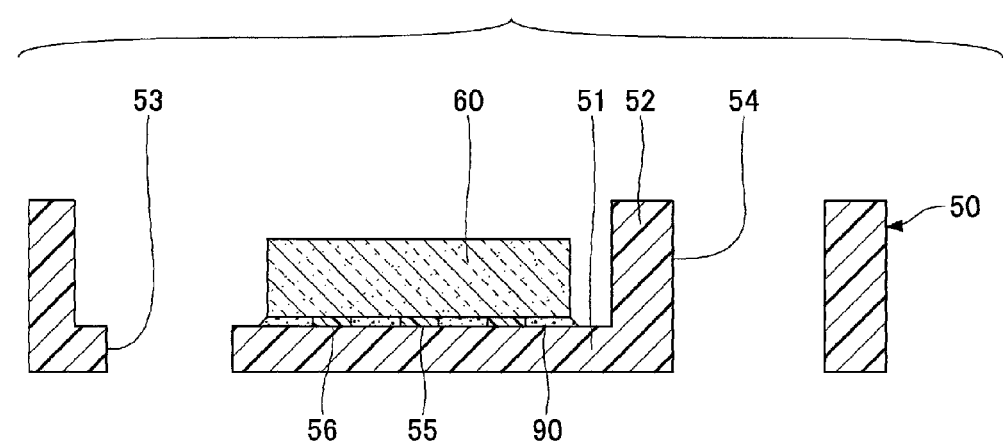

At a step illustrated by FIGS. 14A and 14B, the semiconductor device 60 is mounted on the substrate 50. More specifically, the semiconductor device 60 mounted via the resist spacers 56 on the upper surface of the bottom plate 51 of the substrate 50, and the adhesive resin 90 is cured by, for example, heating. FIG. 14A is a plan view, and FIG. 14B is a cross-sectional view taken along line D-D of FIG. 14A.

Then, steps similar to those described with reference to FIGS. 4A through 8B in the first embodiment are performed to produce multiple semiconductor modules 3 (see FIG. 12). The steps include a step of wire-bonding the metal wires 70 to the electrodes 61 of the semiconductor device 60. Even though the adhesive resin 90 with a low Young's modulus is used, wire-bonding can be performed stably because the resist spacers 56 are provided below the semiconductor device 60 (i.e., the resist spacers 56 improve wire bondability).

When the resist spacers 56 are not provided and the semiconductor device 60 is fixed to the substrate 50 via the adhesive resin 90 having a low Young's modulus, the wire bondability in bonding the metal wires 70 to the electrodes 61 of the semiconductor device 60 is reduced. In such a case, it is necessary to use an adhesive resin such as an epoxy resin having relatively high elasticity instead of the adhesive resin with a low Young's modulus. However, when the semiconductor device 60 is a pressure sensor, because the adhesive resin with high elasticity cannot absorb external stress, the characteristic of the semiconductor device 60 changes.

In the present embodiment, the adhesive resin 90 with a low Young's modulus is used in combination with the resist spacers 56. This configuration makes it possible to prevent reduction in wire-bondability. Also with this configuration, even when the semiconductor device 60 is a pressure sensor, stress on the semiconductor device 60 can be absorbed by the adhesive resin 90 with a low Young's modulus, and the characteristic change of the semiconductor device 60 can be prevented.

Thus, in the semiconductor module 3 of the present embodiment, different from the related-art configuration where a semiconductor device of a second layer is directly stacked on a semiconductor device of a first layer, the substrate 50 is provided immediately below the semiconductor device 60 of the second layer. This configuration makes it possible to form the resist partition 55 to partition the upper surface of the bottom plate 51 into areas and to apply the adhesive resin 90 with a low Young's modulus separately to each of the areas. Also, this configuration makes it possible to form the resist spacers 56 to improve wire-bondability. As a variation, only the resist spacers 56 may be formed on the bottom plate 51 without forming the resist partition 55.

Fourth Embodiment

According to a fourth embodiment, a three-layered semiconductor module is provided. In the fourth embodiment, descriptions of components that are the same as the components of the semiconductor module 1 of the first embodiment may be omitted.

Figure 15:
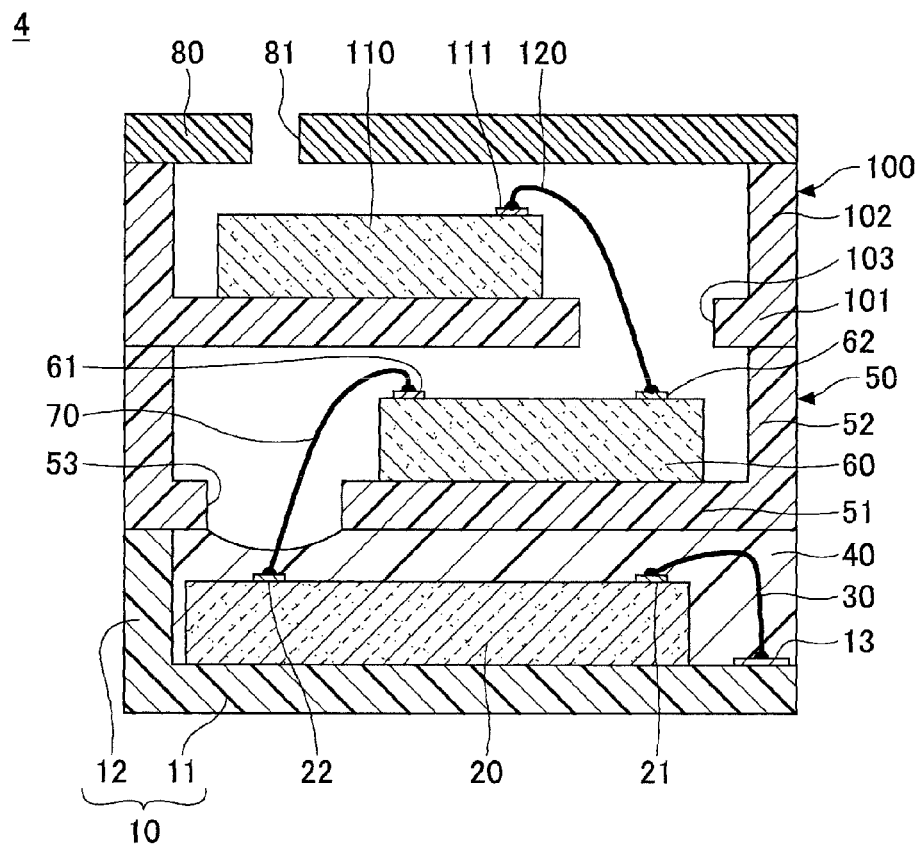
FIG. 15 is a cross-sectional view of a semiconductor module according to a fourth embodiment.

FIG. 15 is a cross-sectional view of a semiconductor module 4 according to the fourth embodiment. The cross section of FIG. 15 corresponds to the cross section of FIG. 1A.

As illustrated by FIG. 15, different from the semiconductor module 1 (see FIG. 1A) having a two-layer structure, the semiconductor module 4 has a three-layer structure. More specifically, the semiconductor module 4 additionally includes a substrate 100 between the substrate 50 and the cover substrate 80.

The substrate 100 has a configuration similar to the configuration of the substrate 50, and includes a bottom plate 101 and side walls 102 on all four sides (outer edges) of the bottom plate 101. In other words, a box-shaped recess is formed by the bottom plate 101 and the side walls 102 of the substrate 100. A through hole 103 is formed in the bottom plate 101 of the substrate 100. The material and the thickness of the substrate 100 may be the same as those of the substrate 50.

A semiconductor device 110 is mounted in a face-up position on the upper surface of the bottom plate 101 (the bottom of the recess) of the substrate 100. Multiple electrodes 111 are provided on the upper surface of the semiconductor device 110. The electrodes 111 of the semiconductor device 110 are electrically connected to the corresponding electrodes 62 of the semiconductor device 60 via metal wires 120 that pass through the through hole 103. The metal wires 120 may be implemented by, for example, gold wires or copper wires (so-called bonding wires). The cover substrate 80 is fixed to the upper surfaces of the side walls 102 of the substrate 100.

Thus, by stacking, on the substrate 50, an additional substrate with a configuration similar to that of the substrate 50, it is possible to produce a three-layer semiconductor module without increasing the size in plan view of the semiconductor module (or without changing the mounting area). Also, a semiconductor module with four or more layers may be produced by stacking additional substrates with a configuration similar to that of the substrate 50.

Fifth Embodiment

According to a fifth embodiment, a semiconductor module including passive components is provided. In the fifth embodiment, descriptions of components that are the same as the components of the semiconductor module 1 of the first embodiment may be omitted.

Figure 16:
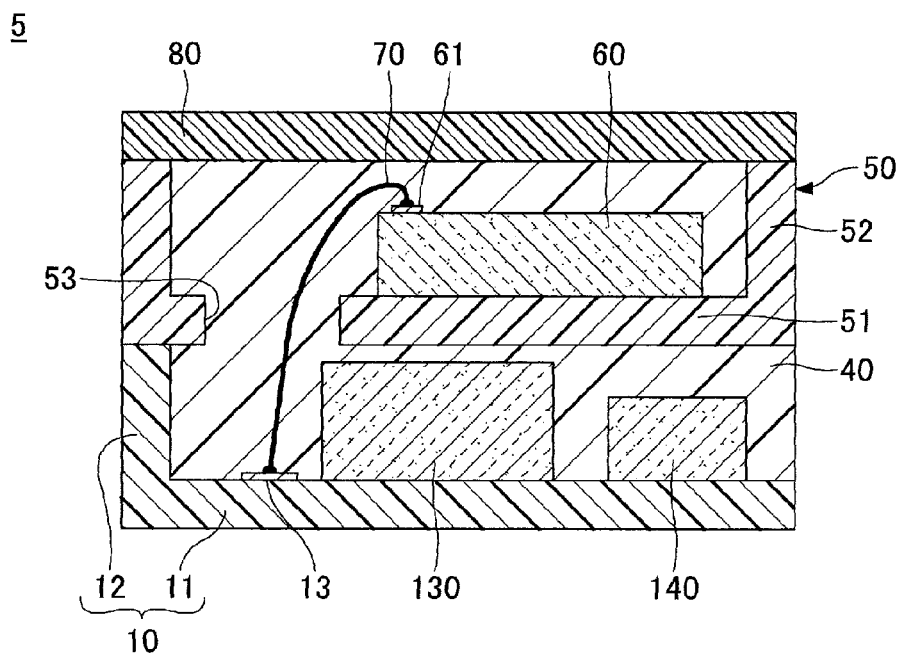
FIG. 16 is a cross-sectional view of a semiconductor module according to a fifth embodiment.

FIG. 16 is a cross-sectional view of a semiconductor module 5 according to the fifth embodiment. The cross section of FIG. 16 corresponds to the cross section of FIG. 1A.

As illustrated by FIG. 16, the semiconductor module 5 of the fifth embodiment is different from the semiconductor module 1 (see FIG. 1A) of the first embodiment in that a resistor 130 and a capacitor 140 are mounted on the bottom plate 11 instead of the semiconductor device 20. First ends of electrodes (not shown) of the resistor 130 and the capacitor 140 are connected to electrodes (not shown) of the substrate 10 by flip-chip bonding. Also, second ends of the electrodes (not shown) of the resistor 130 and the capacitor 140 are connected via wiring (not shown) of the substrate 10 to the electrodes 13, and the electrodes 13 are electrically connected via the metal wires 70 to the electrodes 61 of the semiconductor device 60.

In the present embodiment, it is assumed that the semiconductor device 60 is not a pressure sensor. Because the semiconductor device 60 is not a pressure sensor, the through hole 81 is not formed in the cover substrate 80. Also in the present embodiment, the filling resin 40 fills a space between the substrate 10 and the substrate 50 and also fills a space (a recess formed by the substrate 50) above the bottom plate 51 of the substrate 50. Thus, no hollow space exists in the semiconductor module 5.

As exemplified above, not only semiconductor devices but also passive components such as a resistor and a capacitor may be mounted on the substrate 10 and the substrate 50. Also, a combination of a semiconductor device and a passive component may be mounted on the substrate 10 or the substrate 50. Semiconductor devices and passive components may be referred to as "elements".

Further, areas (or spaces) to be filled with a filling resin may be selected based on functions or types of semiconductor devices and passive components. In such a case, multiple types of filling resins may be used. For example, a space around a passive component may be filled with an epoxy resin, and a space around a semiconductor device may be filled with a silicone resin having low elasticity. This configuration is particularly beneficial when a semiconductor module includes a semiconductor device that is prone to stress (or whose characteristic is changed by stress).

Semiconductor modules and methods for manufacturing the semiconductor modules according to the embodiments of the present invention are described above. However, the present invention is not limited to the specifically disclosed embodiments, and variations and modifications may be made without departing from the scope of the present invention.

For example, multiple semiconductor devices may be mounted on the substrate 10, and multiple semiconductor devices may be mounted on the substrate 50.

An aspect of this disclosure makes it possible to increase the mounting area ratio of a module while maintaining the rigidity of the module.

What is claimed is:

1. A module, comprising:
   a first substrate and first electrodes formed on the first substrate;
   a first element bonded to the first substrate, second electrodes formed on a first end of the first element, and third electrodes formed on a second end of the first element opposite from the first end;
   a second substrate stacked on the first substrate and comprised of a bottom plate and a side wall that form a recess; and
   a second element disposed in the recess and bonded to the bottom plate of the second substrate, and fourth electrodes formed on the second element,
   wherein
   the first electrodes on the first substrate are electrically connected to the second electrodes on the first end of the first element; and
   the third electrodes on the second end of the first element are electrically connected to the fourth electrodes on the second element via wires that pass through an opening formed in the bottom plate of the second substrate.

2. The module as claimed in claim 1, further comprising:
   a cover substrate bonded to an upper end of the side wall of the second substrate to cover the recess.

3. The module as claimed in claim 1, wherein the first element is covered by a resin.

4. The module as claimed in claim 1, further comprising:
   a substrate support that is formed on the first element and supports the second substrate.

5. The module as claimed in claim 1, further comprising:
   a first resist formed on the bottom plate of the second substrate; and
   an adhesive resin applied to the first resist,
   wherein the second element is bonded by the adhesive resin to the first resist.

6. The module as claimed in claim 5, further comprising:
   a second resist that is formed on the bottom plate of the second substrate and partitions the bottom plate into areas, wherein
   the first resist is formed in each of the areas; and
   the adhesive resin is applied to the first resist in each of the areas.

7. The module as claimed in claim 5, wherein the adhesive resin for bonding the second element to the first resist has elasticity lower than elasticity of an adhesive resin for bonding the first element to the first substrate.

8. The module as claimed in claim 1, wherein the second element is covered by a resin.

9. The module as claimed in claim 1, wherein two or more elements including the first element are mounted on the first substrate and two or more elements including the second element are mounted on the bottom plate of the second substrate.

\* \* \* \* \*